(12) United States Patent
Kobrin et al.

(10) Patent No.: US 8,178,162 B2
(45) Date of Patent: May 15, 2012

(54) CONTROLLED DEPOSITION OF SILICON-CONTAINING COATINGS ADHERED BY AN OXIDE LAYER

(75) Inventors: Boris Kobrin, Walnut Creek, CA (US); Romuald Nowak, Cupertino, CA (US); Richard C. Yi, Santa Cruz, CA (US); Jeffrey D. Chinn, Foster City, CA (US)

(73) Assignee: Applied Microstructures, Inc., San Jose, CA (US)

( * ) Notice: Subject to any disclaimer, the term of this patent is extended or adjusted under 35 U.S.C. 154(b) by 33 days.

(21) Appl. No.: 12/592,183

(22) Filed: Nov. 19, 2009

(65) Prior Publication Data

US 2010/0075034 A1   Mar. 25, 2010

Related U.S. Application Data

(62) Division of application No. 10/862,047, filed on Jun. 4, 2004, now Pat. No. 7,638,167.

(51) Int. Cl.
  *C23C 16/00* (2006.01)
(52) U.S. Cl. ............ 427/248.1; 427/255.23; 427/255.27
(58) Field of Classification Search ............... 427/248.1, 427/155.23, 255.272
  See application file for complete search history.

(56) References Cited

U.S. PATENT DOCUMENTS

| | | | |
|---|---|---|---|
| 4,002,512 A | 1/1977 | Lim | |
| 4,188,444 A | 2/1980 | Landau | |
| 5,087,525 A | 2/1992 | Goodman et al. | |
| 5,480,488 A | 1/1996 | Bittner et al. | |
| 5,879,459 A | 3/1999 | Gadgil et al. | |
| 5,966,499 A | 10/1999 | Hinkle et al. | |
| 5,989,345 A | 11/1999 | Hatano | |
| 6,287,635 B1 * | 9/2001 | Cook et al. | 427/255.18 |
| 6,503,330 B1 | 1/2003 | Sneh et al. | |
| 6,743,516 B2 * | 6/2004 | Murphy et al. | 428/447 |
| 6,743,736 B2 | 6/2004 | Mardian et al. | |
| 6,905,549 B2 | 6/2005 | Okuda et al. | |
| 2002/0164420 A1 | 11/2002 | Derderian et al. | |
| 2003/0180458 A1 | 9/2003 | Sneh | |
| 2004/0077184 A1 | 4/2004 | Anderson et al. | |
| 2004/0182316 A1 | 9/2004 | Watanabe | |
| 2004/0261703 A1 | 12/2004 | Kobrin et al. | |
| 2005/0081787 A1 | 4/2005 | Im et al. | |
| 2005/0109277 A1 | 5/2005 | Kobrin et al. | |

* cited by examiner

*Primary Examiner* — Kelly M Gambetta
(74) *Attorney, Agent, or Firm* — Martine Penilla Group, LLP

(57) ABSTRACT

We have developed an improved vapor-phase deposition method and apparatus for the application of films/coatings on substrates. The method provides for the addition of a precise amount of each of the reactants to be consumed in a single reaction step of the coating formation process. In addition to the control over the amount of reactants added to the process chamber, the present invention requires precise control over the total pressure (which is less than atmospheric pressure) in the process chamber, the partial vapor pressure of each vaporous component present in the process chamber, the substrate temperature, and typically the temperature of a major processing surface within said process chamber. Control over this combination of variables determines a number of the characteristics of a film/coating or multi-layered film/coating formed using the method. By varying these process parameters, the roughness and the thickness of the films/coatings produced can be controlled.

15 Claims, 7 Drawing Sheets

CONTROLLED DEPOSITION OF SILICON-CONTAINING COATINGS ADHERED BY AN OXIDE LAYER

CROSS-REFERENCE TO RELATED APPLICATIONS

This application is a divisional of U.S. patent application Ser. No. 10/862,047, filed on Jun. 4, 2004, now U.S. Pat. No. 7,638,167, the disclosure of which is hereby incorporated by reference in its entirety for all purposes.

BACKGROUND OF THE INVENTION

1. Field of the Invention

The present invention pertains to a method, and to the resulting structure which is created by the method, of depositing a coating from vaporous precursors in a manner that the surface of the deposited coating is functionally designed on a nanometer scale. The method is described with reference to deposition of an oxide layer which is chemically bonded to an underlying structure, and to an overlying silicon-containing coating which is adhered by chemical bonding to the oxide layer. The oxide layer and the silicon-containing layer may be deposited in sequence or simultaneously.

2. Brief Description of the Background Art

Integrated circuit (IC) device fabrication, micro-electromechanical systems (MEMS) fabrication, microfluidics, and microstructure fabrication in general make use of layers or coatings of materials which are deposited on a substrate for various purposes. In some instances, the layers are deposited on a substrate and then are subsequently removed, such as when the layer is used as a patterned masking material and then is subsequently removed after the pattern is transferred to an underlying layer. In other instances, the layers are deposited to perform a function in a device or system and remain as part of the fabricated device. There are numerous methods for depositing a thin film or a coating, such as, for example: Sputter deposition, where an ion plasma is used to sputter atoms from a target material (commonly a metal), and the sputtered atoms deposit on the substrate; chemical vapor deposition, where activated (e.g. by means of plasma, radiation, or temperature, or a combination thereof) species react either in a vapor phase (with subsequent deposition of the reacted product on the substrate) or react on the substrate surface to produce a reacted product on the substrate; evaporative deposition, where evaporated material condenses on a substrate to form a layer; and, spin-on, spray-on, wiped, or dipped-on deposition, typically from a solvent solution of the coating material, where the solvent is subsequently rinsed or evaporated off to leave the coating material on the substrate.

In many applications where the wear on the coating is likely to occur due to mechanical contact or where fluid flow is to occur over the substrate surface on which the layer of coating is present, it is helpful to have the coating chemically bonded directly to the substrate surface via chemical reaction of active species which are present in the coating reactants/materials with active species on the substrate surface. In addition, particular precursor materials may be selected which are known to provide particular functional moieties.

With respect to layers and coatings which are chemically bonded to the substrate surface, there are a number of areas of particular current interest. By way of example, and not by way of limitation, such coatings may be used for biotechnology applications, where the surface wetting properties are useful for analytical purposes, for controlling fluid flow and sorting of fluid components, and for altering the composition of components which come into contact with the surface, for example. Such coatings may also be used in the field of integrated circuitry, or when there is a combination of integrated circuitry with mechanical systems, which are referred to as micro-electromechanical systems, or MEMS. Due to the nanometer size scale of some of applications for coatings exhibiting specialized functionality, a need has grown for improved methods of controlling the formation of the coating, including the formation of individual layers within a multi-layered coating. Historically, these types of coatings were deposited by contacting a substrate surface with a liquid phase. While this technique enables efficient coating deposition, it frequently results in limited film property control. In the case of coating a surface of a nanometer scale device, use of liquid phase processing limits device yield due to contamination and capillary forces. More recently, deposition of coatings from a vapor-phase has been used in an attempt to improve coating properties. However, the common vapor-phase deposition methods may not permit sufficient control of the molecular level reactions taking place during the deposition of surface bonding layers or during the deposition of functional coatings, when the deposited coating needs to function on a nanometer (nm) scale.

For purposes of illustrating methods of coating formation where vaporous and liquid precursors are used to deposit a coating on a substrate, applicants would like to mention the following publications and patents which relate to methods of coating formation, for purposes of illustration. Most of the background information provided is with respect to various chlorosilane-based precursors; however it is not intended that the present invention be limited to this class of precursor materials. In addition, applicants would like to make it clear that some of this Background Art is not prior art to the present invention. It is mentioned here because it is of interest to the general subject matter.

In an article by Barry Arkles entitled "Tailoring surfaces with silanes", published in CHEMTECH, in December of 1977, pages 766-777, the author describes the use of organo silanes to form coatings which impart desired functional characteristics to an underlying oxide-containing surface. In particular, the organo silane is represented as $R_nSiX_{(4-n)}$ where X is a hydrolyzable group, typically halogen, alkoxy, acyloxy, or amine. Following hydrolysis, a reactive silanol group is said to be formed which can condense with other silanol groups, for example, those on the surface of siliceous fillers, to form siloxane linkages. Stable condensation products are said to be formed with other oxides in addition to silicon oxide, such as oxides of aluminum, zirconium, tin, titanium, and nickel. The R group is said to be a nonhydrolyzable organic radical that may possess functionality that imparts desired characteristics. The article also discusses reactive tetra-substituted silanes which can be fully substituted by hydrolyzable groups and how the silicic acid which is formed from such substituted silanes readily forms polymers such as silica gel, quartz, or silicates by condensation of the silanol groups or reaction of silicate ions. Tetrachlorosilane is mentioned as being of commercial importance since it can be hydrolyzed in the vapor phase to form amorphous fumed silica.

The article by Dr. Arkles shows how a substrate with hydroxyl groups on its surface can be reacted with a condensation product of an organosilane to provide chemical bonding to the substrate surface. The reactions are generally discussed and, with the exception of the formation of amorphous fumed silica, the reactions are between a liquid precursor and a substrate having hydroxyl groups on its surface. A number of different applications and potential applications are discussed.

In an article entitled "Organized Monolayers by Adsorption. 1. Formation and Structure of Oleophobic Mixed Monolayers on Solid Surfaces", published in the Journal of the American Chemical Society, Jan. 2, 1980, pp. 92-98, Jacob Sagiv discussed the possibility of producing oleophobic monolayers containing more than one component (mixed monolayers). The article is said to show that homogeneous mixed monolayers containing components which are very different in their properties and molecular shape may be easily formed on various solid polar substrates by adsorption from organic solutions. Irreversible adsorption is said to be achieved through covalent bonding of active silane molecules to the surface of the substrate.

In June of 1991, D. J. Ehrlich and J. Meingailis published an article entitled "Fast room-temperature growth of $SiO_2$ films by molecular-layer dosing" in Applied Physics Letters 58 (23), pp. 2675-2677. The authors describe a molecular-layer dosing technique for room-temperature growth of $\alpha$-$SiO_2$ thin films, which growth is based on the reaction of $H_2O$ and $SiCl_4$ adsorbates. The reaction is catalyzed by the hydrated $SiO_2$ growth surface, and requires a specific surface phase of hydrogen-bonded water. Thicknesses of the films is said to be controlled to molecular-layer precision; alternatively, fast conformal growth to rates exceeding 100 nm/min is said to be achieved by slight depression of the substrate temperature below room temperature. Potential applications such as trench filling for integrated circuits and hermetic ultrathin layers for multilayer photoresists are mentioned. Excimer-laser-induced surface modification is said to permit projection-patterned selective-area growth on silicon.

An article entitled "Atomic Layer Growth of $SiO_2$ on Si(100) Using The Sequential Deposition of $SiCl_4$ and $H_2O$" by Sneh et al. in Mat. Res. Soc. Symp. Proc. Vol 334, 1994, pp. 25-30, describes a study in which $SiO_2$ thin films were said to be deposited on Si(100) with atomic layer control at 600° K ($\cong$327° C.) and at pressures in the range of 1 to 50 Torr using chemical vapor deposition (CVD).

In U.S. Pat. No. 5,372,851, issued to Ogawa et al. on Dec. 13, 1995, a method of manufacturing a chemically adsorbed film is described. In particular a chemically adsorbed film is said to be formed on any type of substrate in a short time by chemically adsorbing a chlorosilane based surface active-agent in a gas phase on the surface of a substrate having active hydrogen groups. The basic reaction by which a chlorosilane is attached to a surface with hydroxyl groups present on the surface is basically the same as described in other articles discussed above. In a preferred embodiment, a chlorosilane based adsorbent or an alkoxyl-silane based adsorbent is used as the silane-based surface adsorbent, where the silane-based adsorbent has a reactive silyl group at one end and a condensation reaction is initiated in the gas phase atmosphere. A dehydrochlorination reaction or a de-alcohol reaction is carried out as the condensation reaction. After the dehydrochlorination reaction, the unreacted chlorosilane-based adsorbent on the surface of the substrate is washed with a non-aqueous solution and then the adsorbed material is reacted with aqueous solution to form a monomolecular adsorbed film.

In an article entitled "$SiO_2$ Chemical Vapor Deposition at Room Temperature Using $SiCl_4$ and $H_2O$ with an $NH_3$ Catalyst", by J. W. Klaus and S. M. George in the Journal of the Electrochemical Society, 147 (7) 2658-2664, 2000, the authors describe the deposition of silicon dioxide films at room temperature using a catalyzed chemical vapor deposition reaction. The $NH_3$ (ammonia) catalyst is said to lower the required temperature for $SiO_2$ CVD from greater than 900° K to about 313-333° K.

U.S. Pat. No. 5,328,768 to Goodwin, issued Jul. 12, 1994, discloses a method and article wherein a glass substrate is provided with a more durable non-wetting surface by treatment with a perfluoroalkyl alkyl silane and a fluorinated olefin telomer on a surface which comprises a silica primer layer. The silica primer layer is said to be preferably pyrolytically deposited, magnetron sputtered, or applied by a sol-gel condensation reaction (i.e. from alkyl silicates or chlorosilanes). A perfluoroalkyl alkyl silane combined with a fluorinated olefin telomer is said to produce a preferred surface treatment composition. The silane/olefin composition is employed as a solution, preferably in a fluorinated solvent. The solution is applied to a substrate surface by any conventional technique such as dipping, flowing, wiping, or spraying.

U.S. Patent Publication No. U.S. 2002/0065663 A1, published on May 30, 2002, and titled "Highly Durable Hydrophobic Coatings And Methods", describes substrates which have a hydrophobic surface coating comprised of the reaction products of a chlorosilyl group containing compound and an alkylsilane. The substrate over which the coating is applied is preferably glass. In one embodiment, a silicon oxide anchor layer or hybrid organo-silicon oxide anchor layer is formed from a humidified reaction product of silicon tetrachloride or trichloromethylsilane vapors at atmospheric pressure. Application of the oxide anchor layer is, followed by the vapor-deposition of a chloroalkylsilane. The silicon oxide anchor layer is said to advantageously have a root mean square surface (RMS) roughness of less than about 6.0 nm, preferably less than about 5.0 nm and a low haze value of less than about 3.0%. The RMS surface roughness of the silicon oxide layer is preferably said to be greater than about 4 nm, to improve adhesion. However, too great an RMS surface area is said to result in large surface peaks, widely spaced apart, which begins to diminish the desirable surface area for subsequent reaction with the chloroalkylsilane by vapor deposition. Too small an RMS surface is said to result in the surface being too smooth, that is to say an insufficient increase in the surface area/or insufficient depth of the surface peaks and valleys on the surface.

Simultaneous vapor deposition of silicon tetrachloride and dimethyldichlorosilane onto a glass substrate is said to result in a hydrophobic coating comprised of cross-linked polydimethylsiloxane which may then be capped with a fluoroalkylsilane (to provide hydrophobicity). The substrate is said to be glass or a silicon oxide anchor layer deposited on a surface prior to deposition of the cross-linked polydimethylsiloxane. The substrates are cleaned thoroughly and rinsed prior to being placed in the reaction chamber.

U.S. Patent Publication No. 2003/0180544 A1, published Sep. 25, 2003, and entitled "Anti-Reflective Hydrophobic Coatings and Methods, describes substrates having anti-reflective hydrophobic surface coatings. The coatings are typically deposited on a glass substrate. A silicon oxide anchor layer is formed from a humidified reaction product of silicon tetrachloride, followed by the vapor deposition of a chloroalkylsilane. The thickness of the anchor layer and the overlayer are said to be such that the coating exhibits light reflectance of less than about 1.5%. The coatings are said to be comprised of the reaction products of a vapor-deposited chlorosilyl group containing compound and a vapor-deposited alkylsilane.

Other known related references pertaining to coatings deposited on a substrate surface from a vapor include the following, as examples and not by way of limitation. U.S. Pat. No. 5,576,247 to Yano et al., issued Nov. 19, 1996, entitled: "Thin layer forming method where hydrophobic molecular layers preventing a BPSG layer from absorbing moisture". U.S. Pat. No. 5,602,671 of Hornbeck, issued Feb. 11, 1997, which describes low surface energy passivation layers for use in micromechanical devices. An article entitled "Vapor phase deposition of uniform and ultrathin silanes", by Yuchun Wang et al., SPIE Vol. 3258-0277-786X (98) 20-28, in which the authors describe uniform, conformal, and ultrathin coatings needed on the surface of biomedical microdevices such as microfabricated silicon filters, in order to regulate hydrophilicity and to minimize unspecific protein adsorption. Jian Wang et al., in an article published in Thin Solid Films 327-329 (1998) 591-594, entitled: "Gold nanoparticulate film bound to silicon surface with self-assembled monolayers", discuss a method for attaching gold nanoparticles to silicon surfaces with a self aligned monolayer (SAM) used for surface preparation".

Patrick W. Hoffmann et al., in an article published by the American Chemical Society, Langmuir 1997, 13, 1877-1880, describe the surface coverage and molecular orientation of monomolecular thin organic films on a Ge/Si oxide substrate. A gas phase reactor was said to have been used to provide precise control of surface hydration and reaction temperatures during the deposition of monofunctional perfluorated alkylsilanes. Complete processing conditions are not provided, and there is no description of the apparatus which was used to apply the thin films. T. M. Mayer et al. describe a "Chemical vapor deposition of fluoroalkylsilane monolayer films for adhesion control in microelectromechanical systems" in J. Vac. Sci. Technol. B 18(5), September/October 2000. This article mentions the use of a remotely generated microwave plasma for cleaning a silicon substrate surface prior to film deposition, where the plasma source gas is either water vapor or oxygen.

U.S. Pat. No. 6,576,489 to Leung et al., issued Jun. 10, 2003 describes methods of forming microstructure devices. The methods include the use of vapor-phase alkylsilane-containing molecules to form a coating over a substrate surface. The alkylsilane-containing molecules are introduced into a reaction chamber containing the substrate by bubbling an anhydrous, inert gas through a liquid source of the alkylsilane-containing molecules, and transporting the molecules with the carrier gas into the reaction chamber. The formation of the coating is carried out on a substrate surface at a temperature ranging between about 15° C. and 100° C., at a pressure in the reaction chamber which is said to be below atmospheric pressure, and yet sufficiently high for a suitable amount of alkylsilane-containing molecules to be present for expeditious formation of the coating.

Various methods useful in applying layers and coatings to a substrate have been described above, and there is not sufficient space available here to discuss even a minor portion of the numerous patents and publications which relate to the deposition of functional coatings on substrates. However, upon reading these informative descriptions, it becomes readily apparent that control of coating deposition on a molecular level is not addressed in detail in most instances. When this is discussed, the process is typically described in generalized terms like those mentioned directly above, which terms are not enabling to one skilled in the art, but merely suggest experimentation. To provide a monolayer or a few layers of a functional coating on a substrate surface which is functional or exhibits features on a nanometer scale, it is necessary to tailor the coating precisely. Without precise control of the deposition process, the coating may lack thickness uniformity and surface coverage, providing a rough surface. Or, the coating may vary in chemical composition across the surface of the substrate. Or, the coating may differ in structural composition across the surface of the substrate. Any one of these non-uniformities may result in functional discontinuities and defects on the coated substrate surface which are unacceptable for the intended application of the coated substrate.

U.S. patent application Ser. No. 10/759,857 of the present applicants describes processing apparatus which can provide specifically controlled, accurate delivery of precise quantities of reactants to the process chamber, as a means of improving control over a coating deposition process. The subject matter of the '857 application is hereby incorporated by reference in its entirety. The focus of the present application is the control of process conditions in the reaction chamber in a manner which, in combination with delivery of accurate quantities of reactive materials, provides a uniform, functional coating on a nanometer scale. The coating exhibits sufficient uniformity of thickness, chemical composition and structural composition over the substrate surface that such nanometer scale functionality is achieved.

SUMMARY OF THE INVENTION

We have developed an improved vapor-phase deposition method and apparatus for the application of layers and coatings on multiple substrates. The method and apparatus are useful in the fabrication of biotechnologically functional devices, the fabrication of electronic devices, the fabrication of micro-electromechanical systems (MEMS) and Bio-MEMS devices, and in the fabrication of microfluidic devices. The coating formation method employs a batch-like addition and mixing of all of the reactants to be consumed in a given process step, whether that step is one in a series of steps or is the sole step in a coating formation process. In some instances, the coating formation process may include a number of individual steps where repetitive reactive processes are carried out in each individual step. The apparatus used to carry out the method provides for the addition of a precise amount of each of the reactants to be consumed in a single reaction step of the coating formation process. The apparatus may provide for precise addition of quantities of different combinations of reactants during each individual step when there are a series of different individual steps in the coating formation process.

In addition to the control over the amount of reactants added to the process chamber, the present invention requires precise control over the cleanliness of the substrate, the order of reactant(s) introduction, the total pressure (which is typically less than atmospheric pressure) in the process chamber, the partial vapor pressure of each vaporous component present in the process chamber, the temperature of the substrate and chamber walls. The control over this combination of variables determines the deposition rate and properties of the deposited layers. By varying these process parameters, we control the amount of the reactants available, the density of reaction sites, and the film growth rate, which is the result of the balance of the competitive adsorption and desorption processes on the substrate surface, as well as any gas phase reactions.

The coating deposition process is carried out in a vacuum chamber where the total pressure is lower than atmospheric pressure and the partial pressure of each vaporous component making up the reactive mixture is specifically controlled so that formation and attachment of molecules on a substrate surface are well controlled processes that can take place in a predictable manner, without starving the reaction from any of the precursors. As previously mentioned, the surface concentration and location of reactive species are controlled using total pressure in the processing chamber, the kind and number of vaporous components present in the process chamber, the partial pressure of each vaporous component in the chamber, temperature of the substrate, temperature of the process chamber walls, and the amount of time that a given set of conditions is maintained.

In some instances, where it is desired to have a particularly uniform growth of the composition across the coating surface, or a variable composition across the thickness of a multi-layered coating, more than one batch of reactants may be charged to the process chamber during formation of the coating.

The coatings formed by the method of the invention are sufficiently controlled that the surface roughness of the coating in terms of RMS is less than about 10 nm, and is typically in the range of about 0.5 nm to 5 nm.

An example of the application of the method described here is deposition of ultrathin oxide films on a multitude of substrates. Such oxide films can serve as a bonding, wetting, adhesion, or primer layer (subsequently referred to as a "bonding" layer herein for general purposes of ease in description) for subsequently deposited various molecular coatings, including, for example, silane-based silicon-containing coatings.

By controlling the precise thickness, chemical, and structural composition of a bonding oxide layer on a substrate, for example, we are able to direct the coverage and the functionality of a coating applied over the bonding oxide layer. The coverage and functionality of the coating can be controlled over the entire substrate surface on a nm scale.

With reference to chlorosilane-based coating systems of the kind described in the Background Art section of this application, for example, and not by way of limitation, the degree of hydrophobicity of the substrate after deposition of an oxide bonding layer and after deposition of an overlying silane-based polymeric coating can be uniformly controlled over the substrate surface. By controlling a deposited bonding layer (for example) surface coverage and roughness in a uniform manner, (as a function of oxide deposition parameters described above, for example and not by way of limitation), we are able to control the concentration of OH reactive species on the substrate surface. This, in turn, controls the density of reaction sites needed for subsequent deposition of a silane-based polymeric coating. Control of the substrate surface active site density enables uniform growth and application of high density self-aligned monolayer coatings (SAMS), for example.

Another important aspect of the present invention is the surface preparation of the substrate prior to initiation of any deposition reaction on the substrate surface. The hydrophobicity of a given substrate surface may be measured using a water droplet shape analysis method, for example. Silicon substrates, when treated with oxygen-containing plasmas, can be freed from organic contaminants and typically exhibit a water contact angle below 10°, indicative of a hydrophilic property of the treated substrate. In the case of more hydrophobic substrates, such as, for example, plastics or metals, the deposition or creation of every thin oxide layer on the substrate surface may be used to alter the hydrophobicity of the substrate surface. The oxide layer may comprise aluminum oxide, titanium oxide, or silicon oxide, by way of example and not by way of limitation. When the oxide layer is aluminum or titanium oxide, an auxiliary process chamber (to the process chamber described herein) may be used to create this oxide layer. When the oxide layer is a silicon oxide layer, the silicon oxide layer may be applied by the method of the present invention, to provide a more hydrophilic substrate surface in the form of an oxide bonding layer. For example, the oxide surface hydrophobicity can be adjusted downward to be as low as 5 degrees, rendering the surface hydrophilic.

By controlling the total pressure in the vacuum processing chamber, the number and kind of vaporous components charged to the process chamber, the partial pressure of each vaporous component, the substrate temperature, the temperature of the process chamber walls, and the time over which particular conditions are maintained, the chemical reactivity and properties of the coating can be controlled. By controlling the process parameters, both density of film coverage over the substrate surface and structural composition over the substrate surface are more accurately controlled, enabling the formation of very smooth films, which typically range from about 0.1 nm to less than about 5 nm, and even more typically from about 1 nm to about 3 nm in surface RMS roughness. The thickness of smooth oxide bonding layer films typically ranges from about 0.2 nm to about 50 nm. These smooth films can be tailored in thickness, roughness, hydrophobicity/hydrophilicity, and density, which makes them particularly well suited for applications in the field of biotechnology and electronics and as bonding layers for various functional coatings in general.

In instances where it is desired to create multilayered coatings each having a thickness of less than about 10 nm, for example and not by way of limitation, it is advisable to use oxygen plasma treatment prior to and between coating deposition steps. This oxygen plasma treatment activates dangling bonds on the substrate surface, which dangling bonds may be exposed to a controlled partial pressure of water vapor to create a new concentration of OH reactive sites on the substrate surface. The coating deposition process may then be repeated, increasing the coating thickness.

Further, by changing the total pressure in the process chamber and/or limiting the partial pressure of a reactive vaporous component so that the component is "starved" from the reactive substrate surface, the composition of the depositing coating can be "dialed in" to meet particular requirements.

A computer driven process control system may be used to provide for a series of additions of reactants to the process chamber in which the layer or coating is being formed. This process control system typically also controls other process variables, such as, (for example and not by way of limitation), total process chamber pressure (typically less than atmospheric pressure), substrate temperature, temperature of process chamber walls, temperature of the vapor delivery manifolds, processing time for given process steps, and other process parameters if needed.

BRIEF DESCRIPTION OF THE DRAWINGS

FIG. 3A shows the schematic for an AFM picture of a 4 nm thick silicon oxide bonding layer deposited from $SiCl_4$ precursor using the method of the present invention, where the RMS roughness is about 1.4 nm.

FIG. 3B shows the schematic for an AFM picture of a 30 nm thick silicon oxide bonding layer deposited from $SiCl_4$ precursor using the method of the present invention, where the RMS roughness is about 4.2 nm.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

As a basis for understanding the invention, it is necessary to discuss the processing apparatus which permits precise control over the addition of coating precursors and other vaporous components present within the reaction/processing chamber in which the coating is applied. The apparatus described below is not the only apparatus in which the present invention may be practiced, it is merely an example of one apparatus which may be used. One skilled in the art will recognize equivalent elements in other forms which may be substituted and still provide an acceptable processing system.

I. An Apparatus for Vapor Deposition of Thin Coatings

Figure 1:
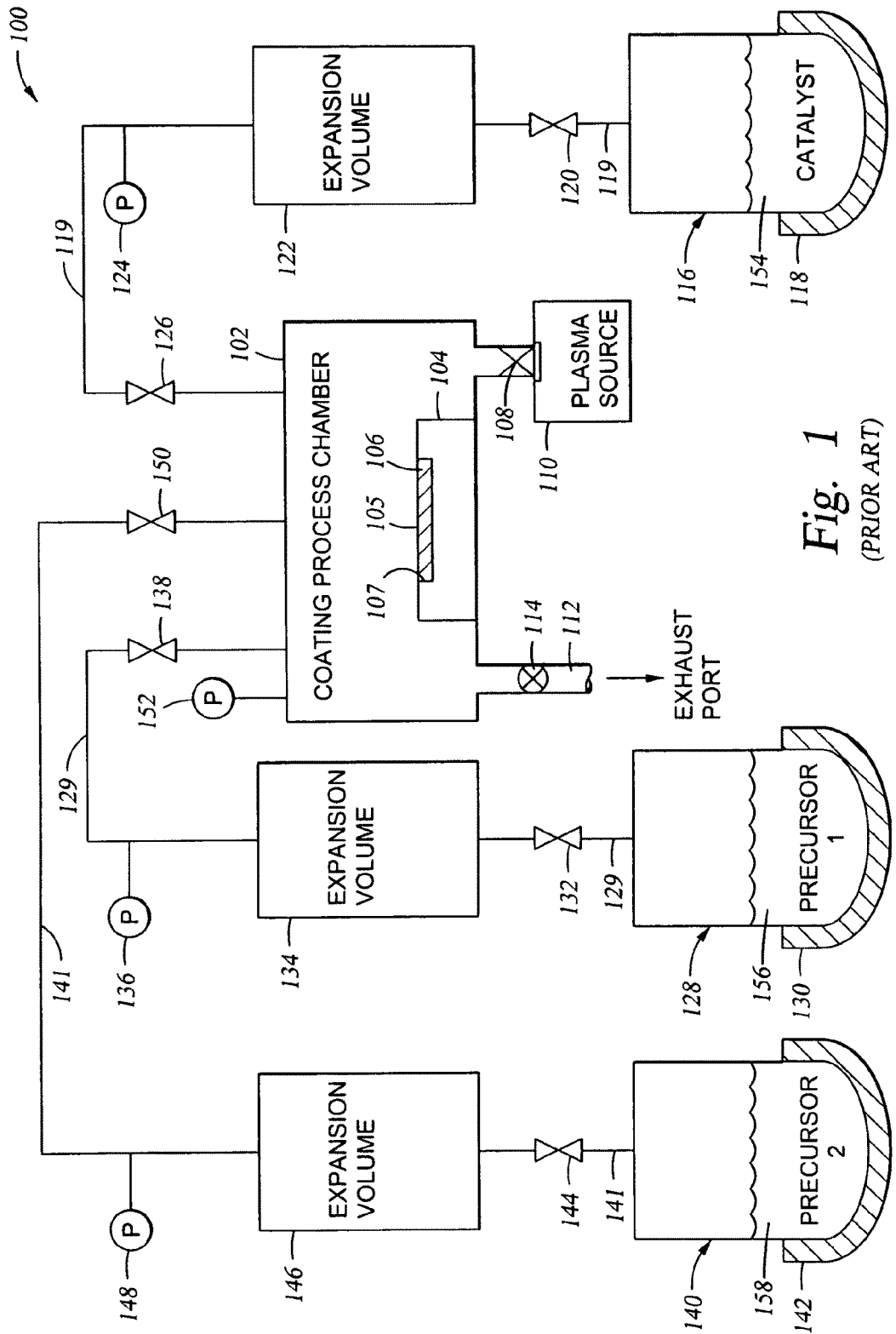
FIG. 1 shows a cross-sectional schematic of one embodiment of the kind of an apparatus which can be used to carry out a vapor deposition of a coating in accordance with the method of the present invention.

FIG. 1 shows a cross-sectional schematic of an apparatus 100 for vapor deposition of thin coatings. The apparatus 100 includes a process chamber 102 in which thin (typically 0.5 nm to 50 nm thick) coatings are vapor deposited. A substrate 106 to be coated rests upon a temperature controlled substrate holder 104, typically within a recess 107 in the substrate holder 104.

Depending on the chamber design, the substrate 106 may rest on the chamber bottom (not shown in this position in FIG. 1). Attached to process chamber 102 is a remote plasma source 110, connected via a valve 108. Remote plasma source 110 may be used to provide a plasma which is used to clean and/or convert a substrate surface to a particular chemical state prior to application of a coating (which enables reaction of coating species and/or catalyst with the surface, thus improving adhesion and/or formation of the coating); or may be used to provide species helpful during formation of the coating (not shown) or modifications of the coating after deposition. The plasma may be generated using a microwave, DC, or inductive RF power source, or combinations thereof. The process chamber 102 makes use of an exhaust port 112 for the removal of reaction byproducts and is opened for pumping/purging the chamber 102. A shut-off valve or a control valve 114 is used to isolate the chamber or to control the amount of vacuum applied to the exhaust port. The vacuum source is not shown in FIG. 1.

The apparatus 100 shown in FIG. 1 is illustrative of a vapor deposited coating which employs two precursor materials and a catalyst. One skilled in the art will understand that one or more precursors and from zero to multiple catalysts may be used during vapor deposition of a coating. A catalyst storage container 116 contains catalyst 154, which may be heated using heater 118 to provide a vapor, as necessary. It is understood that precursor and catalyst storage container walls, and transfer lines into process chamber 102 will be heated as necessary to maintain a precursor or catalyst in a vaporous state, minimizing or avoiding condensation. The same is true with respect to heating of the interior surfaces of process chamber 102 and the surface of substrate 106 to which the coating (not shown) is applied. A control valve 120 is present on transfer line 119 between catalyst storage container 116 and catalyst vapor reservoir 122, where the catalyst vapor is permitted to accumulate until a nominal, specified pressure is measured at pressure indicator 124. Control valve 120 is in a normally-closed position and returns to that position once the specified pressure is reached in catalyst vapor reservoir 122. At the time the catalyst vapor in vapor reservoir 122 is to be released, valve 126 on transfer line 119 is opened to permit entrance of the catalyst present in vapor reservoir 122 into process chamber 102 which is at a lower pressure. Control valves 120 and 126 are controlled by a programmable process control system of the kind known in the art (which is not shown in FIG. 1).

A Precursor 1 storage container 128 contains coating reactant Precursor 1, which may be heated using heater 130 to provide a vapor, as necessary. As previously mentioned, Precursor 1 transfer line 129 and vapor reservoir 134 internal surfaces are heated as necessary to maintain a Precursor 1 in a vaporous state, minimizing and preferably avoiding condensation. A control valve 132 is present on transfer line 129 between Precursor 1 storage container 128 and Precursor 1 vapor reservoir 134, where the Precursor 1 vapor is permitted to accumulate until a nominal, specified pressure is measured at pressure indicator 136. Control valve 132 is in a normally-closed position and returns to that position once the specified pressure is reached in Precursor 1 vapor reservoir 134. At the time the Precursor 1 vapor in vapor reservoir 134 is to be released, valve 138 on transfer line 129 is opened to permit entrance of the Precursor 1 vapor present in vapor reservoir 134 into process chamber 102, which is at a lower pressure. Control valves 132 and 138 are controlled by a programmable process control system of the kind known in the art (which is not shown in FIG. 1).

A Precursor 2 storage container 140 contains coating reactant Precursor 2, which may be heated using heater 142 to provide a vapor, as necessary. As previously mentioned, Precursor 2 transfer line 141 and vapor reservoir 146 internal surfaces are heated as necessary to maintain Precursor 2 in a vaporous state, minimizing, and preferably avoiding condensation. A control valve 144 is present on transfer line 141 between Precursor 2 storage container 146 and Precursor 2 vapor reservoir 146, where the Precursor 2 vapor is permitted to accumulate until a nominal, specified pressure is measured at pressure indicator 148. Control valve 141 is in a normally-closed position and returns to that position once the specified pressure is reached in Precursor 2 vapor reservoir 146. At the time the Precursor 2 vapor in vapor reservoir 146 is to be released, valve 150 on transfer line 141 is opened to permit entrance of the Precursor 2 vapor present in vapor reservoir 146 into process chamber 102, which is at a lower pressure. Control valves 144 and 150 are controlled by a programmable process control system of the kind known in the art (which is not shown in FIG. 1).

During formation of a coating (not shown) on a surface 105 of substrate 106, at least one incremental addition of vapor equal to the vapor reservoir 122 of the catalyst 154, and the vapor reservoir 134 of the Precursor 1, or the vapor reservoir 146 of Precursor 2 may be added to process chamber 102. The total amount of vapor added is controlled by both the adjustable volume size of each of the expansion chambers (typically 50 cc up to 1,000 cc) and the number of vapor injections (doses) into the reaction chamber. Further, the set pressure 124 for catalyst vapor reservoir 122, or the set pressure 136 for Precursor 1 vapor reservoir 134, or the set pressure 148 for Precursor 2 vapor reservoir 146, may be adjusted to control the amount (partial vapor pressure) of the catalyst or reactant added to any particular step during the coating formation process. This ability to control precise amounts of catalyst and vaporous precursors to be dosed (charged) to the process chamber 102 at a specified time provides not only accurate dosing of reactants and catalysts, but repeatability in the vapor charging sequence.

This apparatus provides a relatively inexpensive, yet accurate method of adding vapor phase precursor reactants and catalyst to the coating formation process, despite the fact that many of the precursors and catalysts are typically relatively non-volatile materials. In the past, flow controllers were used to control the addition of various reactants; however, these flow controllers may not be able to handle some of the precursors used for vapor deposition of coatings, due to the low vapor pressure and chemical nature of the precursor materials. The rate at which vapor is generated from some of the precursors is generally too slow to function with a flow controller in a manner which provides availability of material in a timely manner for the vapor deposition process.

The apparatus discussed above allows for accumulation of the specific quantity of vapor in the vapor reservoir which can be charged (dosed) to the reaction. In the event it is desired to make several doses during the coating process, the apparatus can be programmed to do so, as described above. Additionally, adding of the reactant vapors into the reaction chamber in controlled aliquots (as opposed to continuous flow) greatly reduces the amount of the reactants used and the cost of the coating.

One skilled in the art of chemical processing of a number of substrates simultaneously will recognize that a processing system which permits heat and mass transfer uniformly over a number of substrate surfaces simultaneously may be used to carry out the present invention.

II. Exemplary Embodiments of the Method of the Invention

A method of the invention provides for vapor-phase deposition of coatings, where a processing chamber of the kind, or similar to the processing chamber described above is employed. Each coating precursor is transferred in vaporous form to a precursor vapor reservoir in which the precursor vapor accumulates. A nominal amount of the precursor vapor, which is the amount required for a coating layer deposition is accumulated in the precursor vapor reservoir. The at least one coating precursor is charged from the precursor vapor reservoir into the processing chamber in which a substrate to be coated resides. In some instances at least one catalyst vapor is added to the process chamber in addition to the at least one precursor vapor, where the relative quantities of catalyst and precursor vapors are based on the physical characteristics to be exhibited by the coating. In some instances a diluent gas is added to the process chamber in addition to the at least one precursor vapor (and optional catalyst vapor). The diluent gas is chemically inert and is used to increase a total desired processing pressure, while the partial pressure amounts of coating precursors and optionally catalyst components are varied.

The example embodiments described below are with reference to the bonding oxide and the silane-based polymeric coating systems of the kind mentioned above. However, it is readily apparent to one of skill in the art that the concepts involved can be applied to additional coating compositions and combinations which have different functionalities.

Due to the need to control the degree and scale of functionality of the coating at dimensions as small as nanometers, the surface preparation of the substrate prior to application of the coating is very important. One method of preparing the substrate surface is to expose the surface to a uniform, non-physically-bombarding plasma which is typically created from a plasma source gas containing oxygen. The plasma may be a remotely generated plasma which is fed into a processing chamber in which a substrate to be coated resides. Depending on the coating to be applied directly over the substrate, the plasma treatment of the substrate surface may be carried out in the chamber in which the coating is to be applied. This has the advantage that the substrate is easily maintained in a controlled environment between the time that the surface is treated and the time at which the coating is applied. Alternatively, it is possible to use a large system which includes several processing chambers and a centralized transfer chamber which allows substrate transfer from one chamber to another via a robot handling device, where the centralized handling chamber as well as the individual processing chambers are each under a controlled environment.

When a silicon oxide layer is applied to the substrate surface to provide a substrate surface having a controlled hydrophobicity (a controlled availability of reactive hydroxylated sites), the oxide layer may be created using the well-known catalytic hydrolysis of a chlorosilane, such as a tetrachlorosilane, in the manner previously described. A subsequent attachment of an organo-chlorosilane, which may or may not include a functional moiety, may be made to impart a particular function to the finished coating.

The oxide layer may be formed using the method of the present invention by vapor phase hydrolysis of the chlorosilane, with subsequent attachment of the hydrolyzed silane to the substrate surface. Alternatively, the hydrolysis reaction may take place directly on the surface of the substrate, where moisture has been made available on the substrate surface to allow simultaneous hydrolyzation and attachment of the chlorosilane to the substrate surface. The hydrolysis in the vapor phase using relatively wide range of partial pressure of the silicon tetrachloride precursor in combination with a partial pressure in the range of 10 Torr or greater of water vapor will generally result in rougher surfaces on the order of 5 nm RMS or greater, where the thickness of the film formed will typically be in the range of about 20 nm or greater. Thinner films of the kind enabled by one of the embodiments of applicants' invention typically exhibit a 1-5 nm RMS finish and are grown by carefully balancing the vapor and surface hydrolysis reaction components. For example, and not by way of limitation, we have obtained films having a 1-5 nm RMS finish in an apparatus of the kind previously described, where the partial pressure of the silicon tetrachloride is in the range of about 0.5 to 4.0 Torr, the partial pressure of the water vapor is in the range of about 2 to about 8 Torr, where the total process chamber pressure ranges from about 3 Torr to about 10 Torr, where the substrate temperature ranges from about 20° C. to about 60° C., where the process chamber walls are at a temperature ranging from about 30° C. to about 60° C., and where the time period over which the substrate is exposed to the combination of silicon tetrachloride and water vapor ranges from about 2 minutes to about 12 minutes. This deposition process will be described in more detail subsequently herein, with reference to FIGS. 6A through 6C.

EXAMPLE ONE

Deposition of a Silicon Oxide Layer having a Controlled Number of OH Reactive Sites Available on the Oxide Layer Surface A technique for adjusting the hydrophobicity/hydrophilicity of a substrate surface (so that the surface is converted from hydrophobic to hydrophilic or so that a hydrophilic surface is made more hydrophilic, for example) may also be viewed as adjusting the number of OH reactive sites available on the surface of the substrate. One such technique is to apply an oxide coating over the substrate surface while providing the desired concentration of OH reactive sites available on the oxide surface. A schematic 200 of the mechanism of oxide formation in shown in FIG. 2. In particular, a substrate 202 has OH groups 204 present on the substrate surface 203. A chlorosilane 208, such as the tetrachlorosilane shown, and water 206 are reacted with the OH groups 204, either simultaneously or in sequence, to produce the oxide layer 208 shown on surface 203 of substrate 202 and byproduct HCl 210. In addition to chlorosilane precursors, chlorosiloxanes, fluorosilanes, and fluorosiloxanes may be used.

Figure 2:
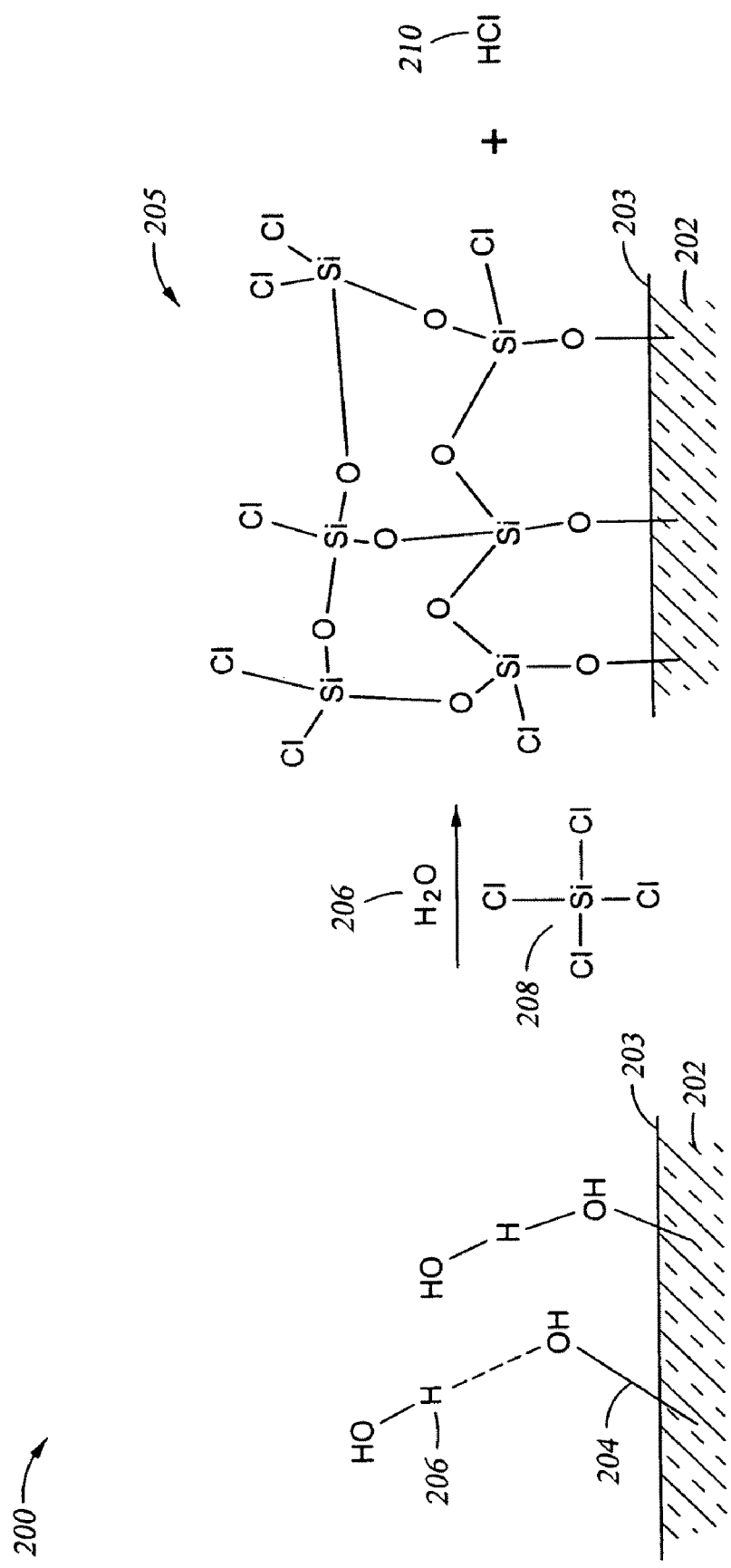
FIG. 2 is a schematic which shows the reaction mechanism where tetrachlorosilane and water are reacted with a substrate which exhibits active hydroxyl groups on the substrate surface, to form a silicon oxide layer on the surface of the substrate.

Subsequent to the reaction shown in FIG. 2, the surface of the oxide layer 208 can be further reacted with water to replace Cl atoms on the upper surface of oxide layer 208 with H atoms, to create new OH groups (not shown). By controlling the amount of water used in both reactions, the frequency of OH reactive sites available on the oxide surface is controlled.

EXAMPLE TWO

In the preferred embodiment discussed below, the silicon oxide coating was applied over a glass substrate. The glass substrate was treated with an oxygen plasma in the presence of residual moisture which was present in the process chamber (after pump down of the chamber to about 20 mTorr) to provide a clean surface (free from organic contaminants) and to provide the initial OH groups on the glass surface.

Various process conditions for the subsequent reaction of the OH groups on the glass surface with vaporous tetrachlorosilane and water are provided below in Table I, along with data related to the thickness and roughness of the oxide coating obtained and the contact angle (indicating hydrophobicity/hydrophilicity) obtained under the respective process conditions. A lower contact angle indicates increased hydrophilicity and an increase in the number of available OH groups on the silicon oxide surface.

TABLE I

Deposition of a Silicon Oxide Layer of Varying Hydrophilicity

| Run No. | Order of Dosing | Partial Pressure $SiCl_4$ Vapor (Torr) | Partial Pressure $H_2O$ Vapor (Torr) | Reaction Time (min.) | Coating Thickness (nm) | Coating Roughness (RMS, nm) * | $SiO_2$ Contact Angle *** (°) |
|---|---|---|---|---|---|---|---|
| 1 | First [2] $SiCi_4$ | 0.8 | 4.0 | 10 | 3 | 1 | <5 |
| 2 | First [1] $H_2O$ | 4.0 | 10.0 | 10 | 35 | 5 | <5 |
| 3 | First [2] $SiCl_4$ | 4.0 | 10.0 | 10 | 30 | 4 | <5 |

| | Order of Dosing | Partial Pressure FOTS Vapor (Torr) | Partial Pressure $H_2O$ Vapor (Torr) | Reaction Time (min.) | Coating Thickness (nm **) | Coating Roughness (RMS, nm) * | FOTS Surface Contact Angle *** (°) |
|---|---|---|---|---|---|---|---|
| 1 | First [3] FOTS | 0.2 | 0.8 | 15 | 4 | 1 | 108 |
| 2 | First [3] FOTS | 0.2 | 0.8 | 15 | 36 | 5 | 109 |

TABLE I-continued

Deposition of a Silicon Oxide Layer of Varying Hydrophilicity

| 3 | First [3] FOTS | 0.2 | 0.8 | 15 | 31 | 4 | 109 |

\* Coating roughness is the RMS roughness measured by AFM (atomic force microscopy).
\*\* The FOTS coating layer was a monolayer which added ≈1 nm in thickness.
\*\*\* Contact angles were measured with 18 MΩ D.I. water.
[1] The $H_2O$ was added to the process chamber 10 seconds before the $SiCl_4$ was added to the process chamber.
[2] The $SiCl_4$ was added to the process chamber 10 seconds before the $H_2O$ was added to the process chamber.
[3] The FOTS was added to the process chamber 5 seconds before the $H_2O$ was added to the process chamber.
[4] The substrate temperature and the chamber wall temperature were each 35° C. for both application of the $SiO_2$ bonding/bonding layer and for application of the FOTS organosilane overlying monolayer (SAM) layer.

We have discovered that very different film thicknesses and film surface roughness characteristics can be obtained as a function of the partial pressures of the precursors, despite the maintenance of the same time period of exposure to the precursors. Table II below illustrates this unexpected result.

TABLE II

Response Surface Design* Silicon Oxide Layer Deposition

| Run No. | Total Pressure (Torr) | Partial Pressure $SiCl_4$ Vapor (Torr) | Partial Pressure $H_2O$ Vapor (Torr) | Substrate and Chamber Wall Temp. ° C. | Reaction Time (min.) | Coating Thickness (nm) | Coating Surface Roughness RMS (nm) |
|---|---|---|---|---|---|---|---|
| 1 | 9.4 | 2.4 | 7 | 35 | 7 | 8.8 | NA |
| 2 | 4.8 | 0.8 | 4 | 35 | 7 | 2.4 | 1.29 |
| 3 | 6.4 | 2.4 | 4 | 35 | 4 | 3.8 | 1.39 |
| 4 | 14.0 | 4.0 | 10 | 35 | 7 | 21.9 | NA |
| 5 | 7.8 | 0.8 | 7 | 35 | 4 | 4.0 | 2.26 |
| 6 | 11.0 | 4.0 | 7 | 35 | 10 | 9.7 | NA |
| 7 | 11.0 | 4.0 | 7 | 35 | 4 | 10.5 | NA |
| 8 | 12.4 | 2.4 | 10 | 35 | 4 | 14.0 | NA |
| 9 | 6.4 | 2.4 | 4 | 35 | 10 | 4.4 | 1.39 |
| 10 | 9.4 | 2.4 | 7 | 35 | 7 | 8.7 | NA |
| 11 | 12.4 | 2.4 | 10 | 35 | 10 | 18.7 | NA |
| 12 | 9.4 | 2.4 | 7 | 35 | 7 | 9.5 | NA |
| 13 | 8.0 | 4.8 | 4 | 35 | 7 | 6.2 | 2.16 |
| 14 | 10.8 | 0.8 | 10 | 35 | 7 | 6.9 | NA |
| 15 | 7.8 | 0.8 | 7 | 35 | 10 | 4.4 | 2.24 |

*(Box-Behnken) 3 Factors, 3 Center Points
NA = Not Available, Not Measured

In addition to the tetrachlorosilane described above as a precursor for oxide formation, other chlorosilane precursors such a trichlorosilanes, dichlorosilanes work well as a precursor for oxide formation. Examples of specific advantageous precursors include hexachlorodisilane ($Si_2Cl_6$) and hexachlorodisiloxane ($Si_2Cl_6O$). As previously mentioned, in addition to chlorosilanes, chlorosiloxanes, fluorosilanes, and fluorosiloxanes may also be used as precursors.

Similarly, the vapor deposited silicon oxide coating from the $SiCl_4$ and $H_2O$ precursors was applied over glass, polycarbonate, acrylic, polyethylene and other plastic materials using the same process conditions as those described above with reference to the silicon substrate. Prior to application of the silicon oxide coating, the surface to be coated was treated with an oxygen plasma.

A silicon oxide coating of the kind described above can be applied over a self aligned monolayer (SAM) coating formed from an organic precursor, for example and not by way of limitation from fluoro-tetrahydrooctyldimethylchlorosilane (FOTS). Prior to application of the silicon oxide coating, the surface of the SAM should be treated with an oxygen plasma. A FOTS coating surface requires a plasma treatment of about 10-30 seconds to enable adhesion of the silicon oxide coating. The plasma treatment creates reactive OH sites on the surface of the SAM layer, which sites can subsequently be reacted with $SiCl_4$ and water precursors, as illustrated in FIG. 2, to create a silicon oxide coating. This approach allows for deposition of multi-layered molecular coatings, where all of the layers may be the same, or some of the layers may be different, to provide particular performance capabilities for the multi-layered coating.

Functional properties designed to meet the end use application of the finalized product can be tailored by either sequentially adding an organo-silane precursor to the oxide coating precursors or by using an organo-silane precursor(s) for formation of the last, top layer coating. Organo-silane precursor materials may include functional groups such that the silane precursor includes an alkyl group, an alkoxyl group, an alkyl substituted group containing fluorine, an alkoxyl substituted group containing fluorine, a vinyl group, an ethynyl group, or a substituted group containing a silicon atom or an oxygen atom, by way of example and not by way of limitation. In particular, organic-containing precursor materials such as (and not by way of limitation) silanes, chlorosilanes, fluorosilanes, methoxy silanes, alkyl silanes, amino silanes, epoxy silanes, glycoxy silanes, and acrylosilanes are useful in general.

Some of the particular precursors used to produce coatings are, by way of example and not by way of limitation, perfluorodecyltrichlorosilanes (FDTS), undecenyltrichlorosilanes (UTS), vinyl-trichlorosilanes (VTS), decyltrichlorosilanes (DTS), octadecyltrichlorosilanes (OTS), dimethyldichlorosilanes (DDMS), dodecenyltricholrosilanes (DDTS), fluorotetrahydrooctyldimethylchlorosilanes (FOTS), perfluorooctyldimethylchlorosilanes, aminopropylmethoxysilanes (APTMS), fluoropropylmethyldichlorosilanes, and perfluorodecyldimethylchlorosilanes. The OTS, DTS, UTS, VTS, DDTS, FOTS, and FDTS are all trichlorosilane precursors. The other end of the precursor chain is a saturated hydrocarbon with respect to OTS, DTS, and UTS; contains a vinyl functional group, with respect to VTS and DDTS; and contains fluorine atoms with respect to FDTS (which also has fluorine atoms along the majority of the chain length). Other useful precursors include 3-aminopropyltrimethoxysilane (APTMS), which provides amino functionality, and 3-glycidoxypropyltrimethoxysilane (GPTMS). One skilled in the art of organic chemistry can see that the vapor deposited coatings from these precursors can be tailored to provide particular functional characteristics for a coated surface.

EXAMPLE THREE

When the oxide-forming silane and the organo-silane which includes the functional moiety are deposited simultaneously (co-deposited), the reaction may be so rapid that the sequence of precursor addition to the process chamber becomes critical. For example, in a co-deposition process of $SiCl_4$/FOTS/$H_2O$, if the FOTS is introduced first, it deposits on the glass substrate surface very rapidly in the form of islands, preventing the deposition of a homogeneous composite film. Examples of this are provided in Table III, below.

When the oxide-forming silane is applied to the substrate surface first, to form the oxide layer with a controlled density of potential OH reactive sites available on the surface, the subsequent reaction of the oxide surface with a FOTS precursor provides a uniform film without the presence of agglomerated islands of polymeric material, examples of this are provided in Table III below.

TABLE III

Deposition of a Coating Upon a Silicon Substrate*
Using Silicon tetrachloride and FOTS Precursors

| Run No. | Total Pressure (Torr) | Partial Pressure $SiCl_4$ Vapor (Torr) | Partial Pressure FOTS Vapor (Torr) | Partial Pressure $H_2O$ Vapor (Torr) | Substrate and Chamber Wall Temp. (° C.) |
|---|---|---|---|---|---|
| 1 FOTS + $H_2O$ | 1 | — | 0.20 | 0.80 | 35 |
| 2 $H_2O$ + $SiCl_4$ followed by FOTS + $H_2O$ | 14 1 | 4 — | — 0.20 | 10 0.80 | 35 35 |
| 3 FOTS + $SiCl_4$ + $H_2O$ | 14.2 | 4 | 0.20 | 10 | 35 |
| 4 $SiCl_4$ + $H_2O$ | 14 | 4 | — | 10 | 35 |
| 5 $SiCl_4$ + $H_2O$ | 5.8 | 0.8 | — | 5 | 35 |
| 6 $SiCl_4$ + $H_2O$ repeated twice | 14 | 4 | — | 10 | 35 |

| | Reaction Time (min.) | Coating Thickness (nm) | Coating Roughness (nm)** RMS | Contact Angle*** (°) |
|---|---|---|---|---|
| 1 | 15 | 0.7 | 0.1 | 110 |
| 2 | 10 + 15 | 35.5 | 4.8 | 110 |
| 3 | 15 | 1.5 | 0.8 | 110 |
| 4 | 10 | 30 | 0.9 | <5 |
| 5 | 10 | 4 | 0.8 | <5 |
| 6 | 10 + 10 | 55 | 1.0 | <5 |

*The silicon substrates used to prepare experimental samples described herein exhibited an initial surface RMS roughness in the range of about 0.1 nm, as measured by Atomic Force Microscope (AFM).
**Coating roughness is the RMS roughness measured by AFM.
***Contact angles were measured with 18 MΩD.I. water.

Most of the silane-based precursors, such as commonly used di- and tri-chlorosilanes, for example and not by way of limitation, tend to create agglomerates on the surface of the substrate during the coating formation. These agglomerates can cause structure malfunctioning or stiction. Such agglomerations are produced by partial hydrolysis and polycondensation of the polychlorosilanes. This agglomeration can be prevented by precise metering of moisture in the process ambient which is a source of the hydrolysis, and by carefully controlled metering of the availability of the chlorosilane precursors to the coating formation process. The carefully metered amounts of material and careful temperature control of the substrate and the process chamber walls can provide the partial vapor pressure and condensation surfaces necessary to control formation of the coating on the surface of the substrate rather than promoting undesired reactions in the vapor phase or on the process chamber walls.

An example process description for Run No. 2 was as follows.

Step 1. Pump down the reactor and purge out the residual air and moisture to a final baseline pressure of about 30 mTorr or less.

Step 2. Perform $O_2$ plasma clean of the substrate surface to eliminate residual surface contamination and to oxygenate/hydroxylate the substrate. The cleaning plasma is an oxygen-containing plasma. Typically the plasma source is a remote plasma source, which may employ an inductive power source. However, other plasma generation apparatus may be used. In any case, the plasma treatment of the substrate is typically carried out in the coating application process chamber. The plasma density/efficiency should be adequate to provide a substrate surface after plasma treatment which exhibits a contact angle of about 10° or less when measured with 18 MΩ D.I. water. The coating chamber pressure during plasma treatment of the substrate surface in the coating chamber was 0.5 Torr, and the duration of substrate exposure to the plasma was 5 minutes.

Step 3. Inject $SiCl_4$ and within 10 seconds inject water vapor at a specific partial pressure ratio to the $SiCl_4$, to form a silicon oxide base layer on the substrate. For example, for the glass substrate discussed in Table III, 1 volume (300 cc at 100 Torr) of $SiCl_4$ to a partial pressure of 4 Torr was injected, then, within 10 seconds 10 volumes (300 cc at 17 Torr each) of water vapor were injected to produce a partial pressure of 10 Ton in the process chamber, so that the volumetric pressure ratio of water vapor to silicon tetrachloride is about 2.5. The substrate was exposed to this gas mixture for 1 min to 15 minutes, typically for about 10 minutes. The substrate temperature in the examples described above was in the range of about 35° C. Substrate temperature may be in the range from about 20° C. to about 80° C. The process chamber surfaces were also in the range of about 35° C.

Step 4. Evacuate the reactor to <30 mTorr to remove the reactants.

Step 5. Introduce the chlorosilane precursor and water vapor to form a hydrophobic coating. In the example in Table III, FOTS vapor was injected first to the charging reservoir, and then into the coating process chamber, to provide a FOTS partial pressure of 200 mTorr in the process chamber, then, within 10 seconds, $H_2O$ vapor (300 cc at 12 Ton) was injected to provide a partial pressure of about 800 mTorr, so that the total reaction pressure in the chamber was 1 Torr. The substrate was exposed to this mixture for 5 to 30 minutes, typically 15 minutes, where the substrate temperature was about 35° C. Again, the process chamber surface was also at about 35° C.

An example process description for Run No. 3 was as follows.

Step 1. Pump down the reactor and purge out the residual air and moisture to a final baseline pressure of about 30 mTorr or less.

Step 2. Perform remote $O_2$ plasma clean to eliminate residual surface contamination and to oxygenate/hydroxylate the glass substrate. Process conditions for the plasma treatment were the same as described above with reference to Run No. 2.

Step 3. Inject FOTS into the coating process chamber to produce a 200 mTorr partial pressure in the process chamber. Then, inject 1 volume (300 cc at 100 Torr) of $SiCl_4$ from a vapor reservoir into the coating process chamber, to a partial pressure of 4 Torr in the coating chamber. Then, within 10 seconds inject 10 volumes (300 cc at 17 Ton each) of water vapor from a vapor reservoir into the coating process chamber, to a partial pressure of 10 Ton in the coating process chamber. Total pressure in the process chamber is then about 14 Torr. The substrate temperature was in the range of about 35° C. for the specific examples described, but could range from about 15° C. to about 80° C. The substrate was exposed to this three gas mixture for about 1-15 minutes, typically about 10 minutes.

Step 4. Evacuate the process chamber to a pressure of about 30 mTorr to remove excess reactants.

EXAMPLE FOUR

Figure 3A:
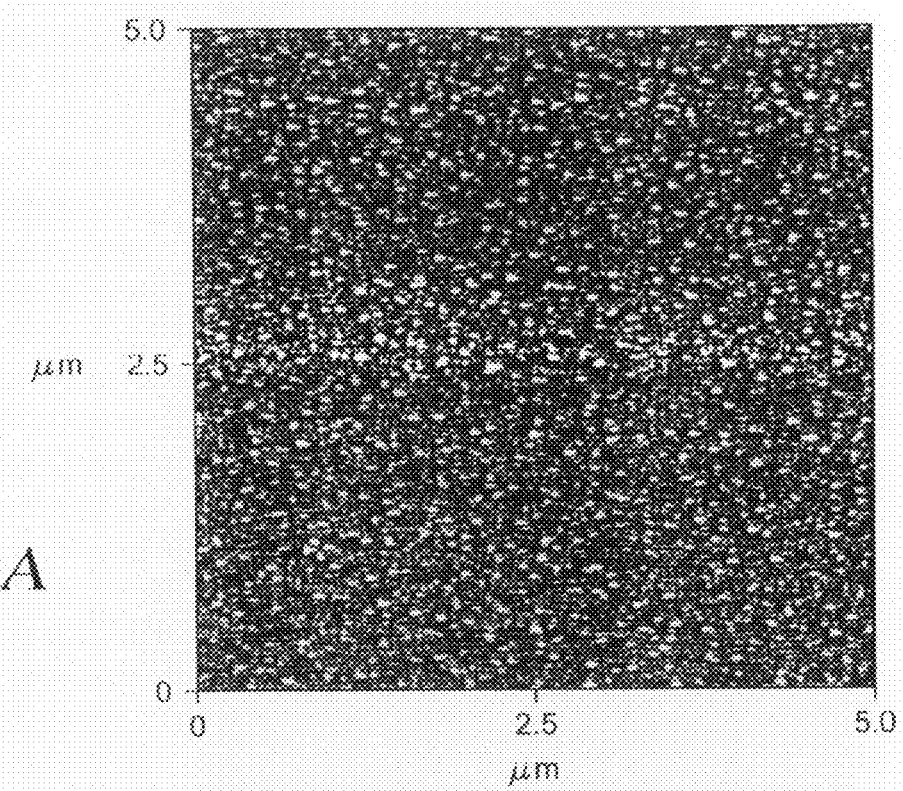
FIGS. 3A and 3B show schematics of atomic force microscope (AFM) images of silicon oxide bonding layers deposited on a silicon substrate. The initial silicon substrate surface RMS roughness measured less than about 0.1 nm.
Figure 3B:
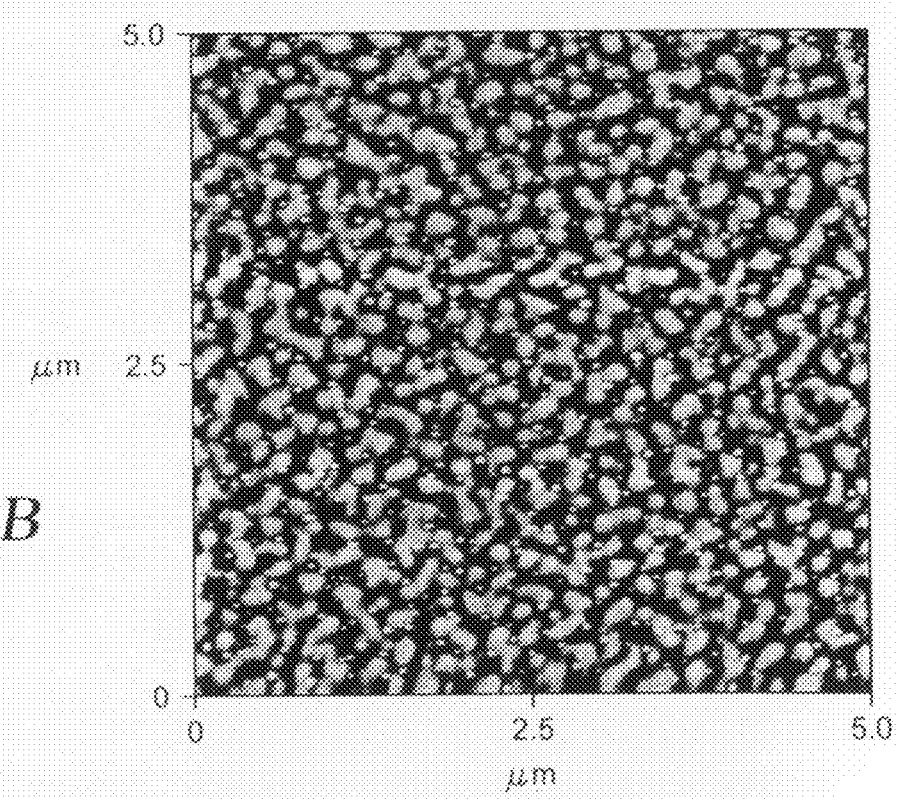

FIGS. 3A and 3B are schematics of AFM (atomic force microscope) images of surfaces of silicon oxide bonding coatings as applied over a silicon substrate. The initial silicon substrate surface RMS roughness was determined to be less than about 0.1 nm. FIG. 3A illustrates a deposition process in which the substrate was silicon. The surface of the silicon was exposed to an oxygen plasma in the manner previously described herein for purposes of cleaning the surface and creating hydroxyl availability on the silicon surface. $SiCl_4$ was charged to the process chamber from a $SiCl_4$ vapor reservoir, creating a partial pressure of 0.8 Ton in the coating process chamber. Within 10 seconds, $H_2O$ vapor was charged to the process chamber from a $H_2O$ vapor reservoir, creating a partial pressure of 4 Ton in the coating process chamber. The total pressure in the coating process chamber was 4.8 Torr. The substrate temperature and the temperature of the process chamber walls was about 35° C. The substrate was exposed to the mixture of $SiCl_4$ and $H_2O$ for a time period of 10 minutes. The silicon oxide coating thickness obtained was about 3 nm. The coating roughness in RMS was 1.4 nm and Ra was 0.94 nm.

FIG. 3B illustrates a deposition process in which the substrate was silicon. The surface of the silicon was exposed to an oxygen plasma in the manner previously described herein for purposes of cleaning the surface and creating hydroxyl availability on the silicon surface. $SiCl_4$ was charged to the process chamber from a $SiCl_4$ vapor reservoir, creating a partial pressure of 4 Torr in the coating process chamber. Within 10 seconds, $H_2O$ vapor was charged to the process chamber from a $H_2O$ vapor reservoir, creating a partial pressure of 10 Torr in the coating process chamber. The total pressure in the coating process chamber was 14 Torr. The substrate temperature and the temperature of the process chamber walls was about 35° C. The substrate was exposed to the mixture of $SiCl_4$ and $H_2O$ for a time period of 10 minutes. The silicon oxide coating thickness obtained was about 30 nm. The coating roughness in RMS was 4.2 nm and Ra was 3.4 nm.

EXAMPLE FIVE

Figure 4:
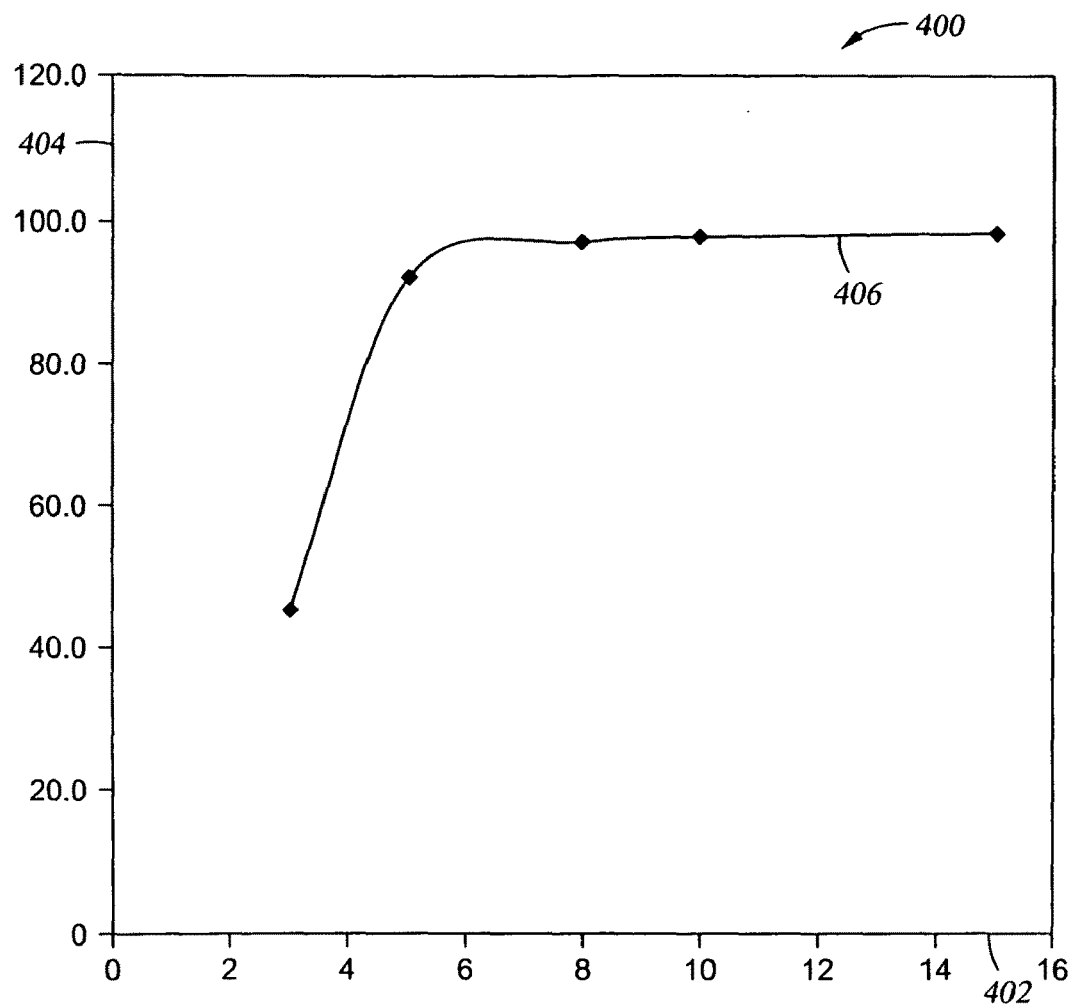
FIG. 4 shows a graph of the water contact angle (proportional to percentage of substrate surface coverage) as a function of time for a coating produced from a dimethyldichlorosilane precursor on the surface of a silicon substrate.

FIG. 4 shows a graph 400 of the dependence of the water contact angle (an indication of hydrophobicity of a surface) as a function of the substrate exposure time for a silicon substrate coated directly with an organo-silane coating generated from a DDMS (dimethyldichlorosilane) precursor. The silicon substrate was cleaned and functionalized to provide surface hydroxyl groups by an oxygen plasma treatment of the kind previously described herein. DDMS was then applied at a partial pressure of 1 Ton, followed within 10 seconds by $H_2O$ applied at a partial pressure of 2 Torr, to produce a total pressure within the process chamber of 3 Ton.

In FIG. 4, graph 400, the substrate exposure period with respect to the DDMS and $H_2O$ precursor combination is shown in minutes on axis 402, with the contact angle shown in degrees on axis 404. Curve 406 illustrates that it is possible to obtain a wide range of hydrophobic surfaces by controlling the process variables in the manner of the present invention. The typical standard deviation of the contact angle was less than 2 degrees across the substrate surface. Both wafer-to wafer and day-to day repeatability of the water contact angle were within the measurement error of ±2° for a series of silicon samples.

Figure 5:
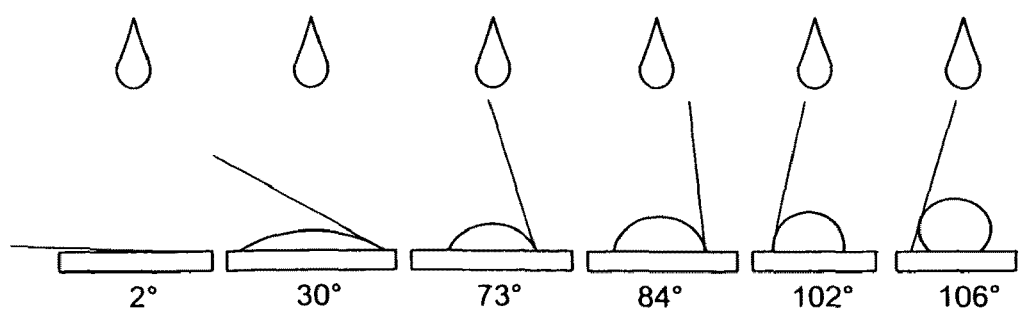
FIG. 5 shows a series of water contact angles measured for a coating surface where the coating was produced from a FOTS precursor on the surface of a silicon substrate. The higher the contact angle, the higher the hydrophobicity of the coating surface.

FIG. 5 illustrates contact angles for a series of surfaces exposed to water, where the surfaces exhibited different hydrophobicity, with an increase in contact angle representing increased hydrophobicity. This data is provided as an illustration to make the contact angle data presented in tables herein more meaningful.

EXAMPLE SIX

Figure 6A:
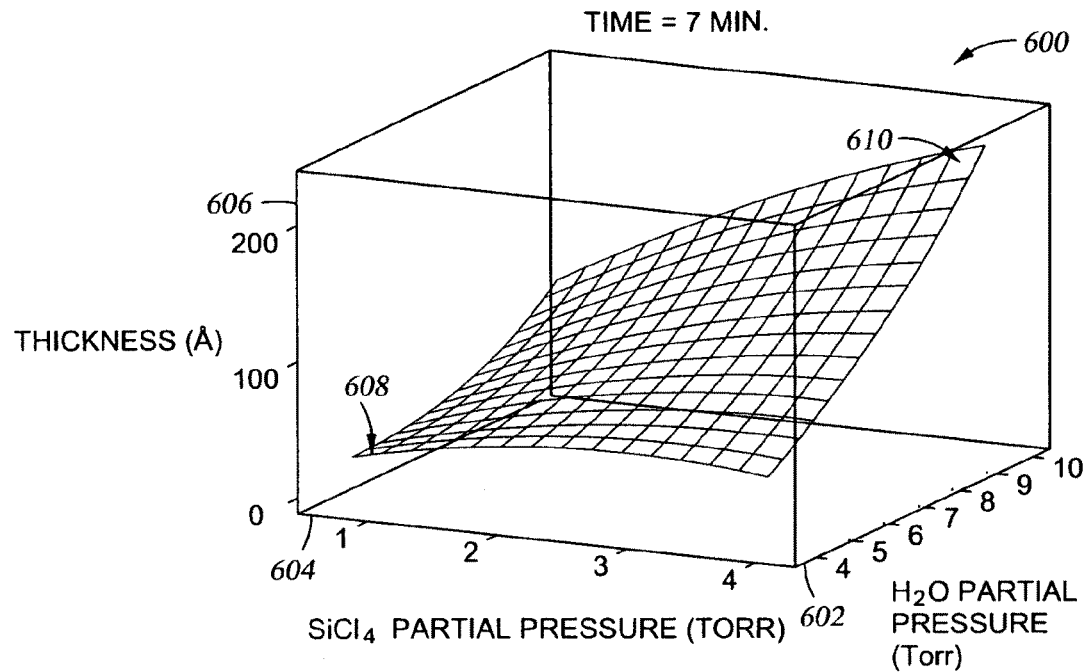
FIG. 6A shows a three dimensional schematic of film thickness of a silicon oxide bonding layer coating deposited on a silicon surface as a function of the partial pressure of silicon tetrachloride and the partial pressure of water vapor present in the process chamber during deposition of the silicon oxide coating, where the time period the silicon substrate was exposed to the coating precursors was four minutes after completion of addition of all precursor materials.
Figure 7A:
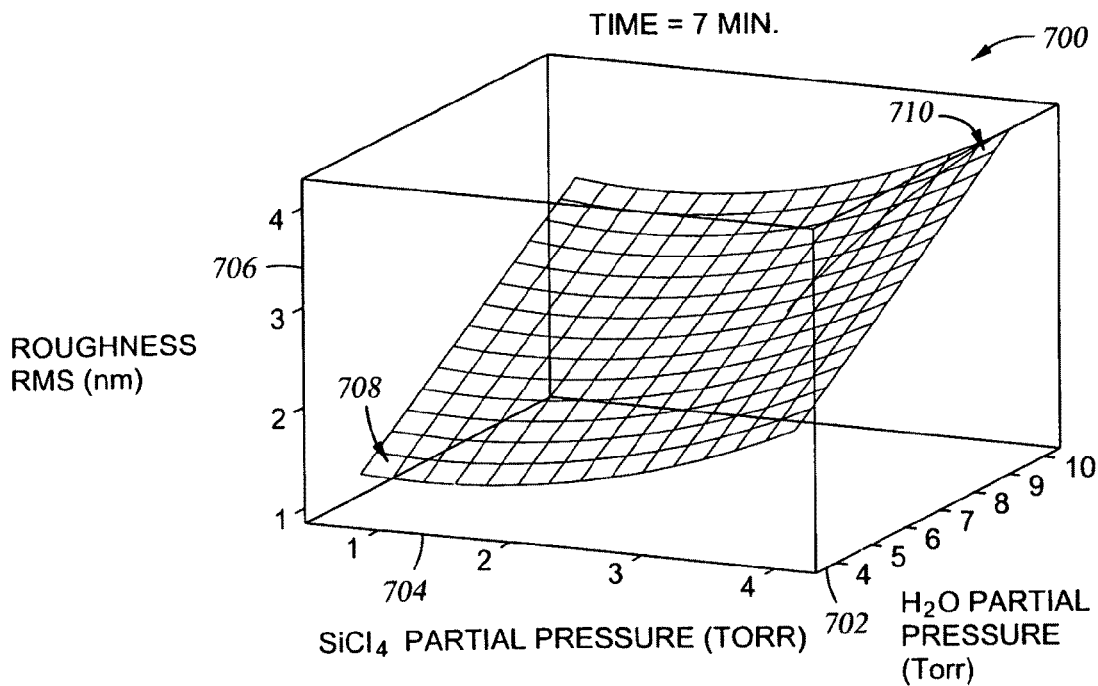
FIG. 7A shows a three dimensional schematic of film roughness in RMS nm of a silicon oxide bonding layer coating deposited on a silicon surface as a function of the partial pressure of silicon tetrachloride and the partial pressure of water vapor present in the process chamber during deposition of the silicon oxide coating, where the time period the silicon substrate was exposed to the coating precursors was four minutes after completion of addition of all precursor materials.

FIG. 6A shows a three dimensional schematic 600 of film thickness of a silicon oxide bonding layer coating deposited on a silicon surface as a function of the partial pressure of silicon tetrachloride and the partial pressure of water vapor present in the process chamber during deposition of the silicon oxide coating, where the temperature of the substrate and of the coating process chamber walls was about 35° C., and the time period the silicon substrate was exposed to the coating precursors was four minutes after completion of addition of all precursor materials. The precursor $SiCl_4$ vapor was added to the process chamber first, with the precursor $H_2O$ vapor added within 10 seconds thereafter. The partial pressure of the $H_2O$ in the coating process chamber is shown on axis 602, with the partial pressure of the $SiCl_4$ shown on axis 604. The film thickness is shown on axis 606 in Angstroms. The film deposition time after addition of the precursors was 4 minutes. The thinner coatings exhibited a smoother surface, with the RMS roughness of a coating at point 608 on Graph 600 being in the range of 1 nm (10 Å). The thicker coatings exhibited a rougher surface, which was still smooth relative to coatings generally known in the art. At point 610 on Graph 600, the RMS roughness of the coating was in the range of 4 nm (40 Å). FIG. 7A shows a three dimensional schematic 700 of the film roughness in RMS, nm which corresponds with the coated substrate for which the coating thickness is illustrated in FIG. 6A. The partial pressure of the $H_2O$ in the coating process chamber is shown on axis 702, with the partial pressure of the $SiCl_4$ shown on axis 704. The film roughness in RMS, nm is shown on axis 706. The film deposition time after addition of all of the precursors was 7 minutes. As previously mentioned, the thinner coatings exhibited a smoother surface, with the RMS roughness of a coating at point 708 being in the range of 1 nm (10 Å) and the roughness at point 710 being in the range of 4 nm (40 Å).

Figure 6B:
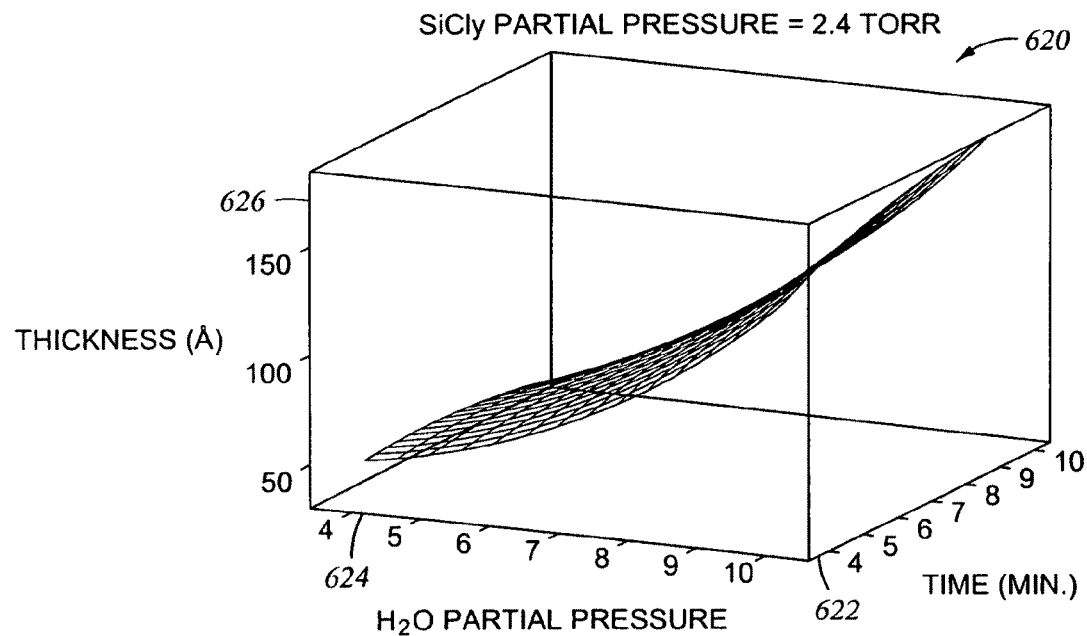
FIG. 6B shows a three dimensional schematic of film thickness of the silicon oxide bonding layer illustrated in FIG. 6A as a function of the water vapor partial pressure and the time period the substrate was exposed to the coating precursors after completion of addition of all precursor materials.

FIG. 6B shows a three dimensional schematic 620 of film thickness of the silicon oxide bonding layer illustrated in FIG. 6A as a function of the water vapor partial pressure and the time period the substrate was exposed to the coating precursors after completion of addition of all precursor materials. The time period of exposure of the substrate is shown on axis 622 in minutes, with the $H_2O$ partial pressure shown on axis 624 in Torr, and the oxide coating thickness shown on axis 626 in Angstroms. The partial pressure of $SiCl_4$ in the silicon oxide coating deposition chamber was 0.8 Torr.

Figure 6C:
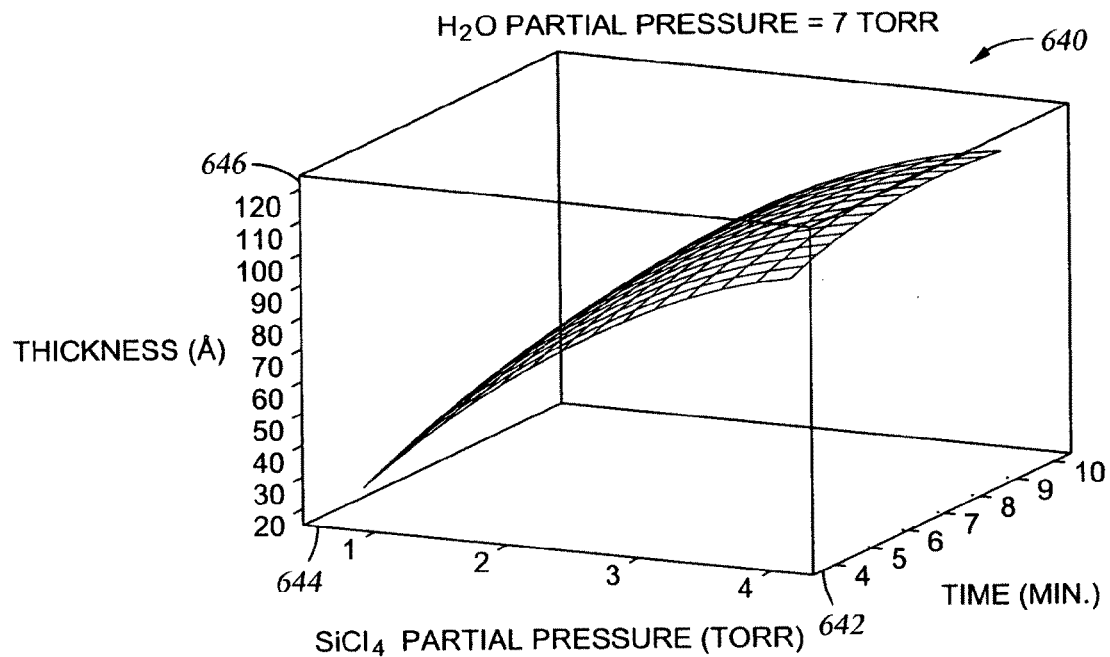
FIG. 6C shows a three dimensional schematic of film thickness of the silicon oxide bonding layer illustrated in FIG. 6A as a function of the silicon tetrachloride partial pressure and the time period the substrate was exposed to the coating precursors after completion of addition of all precursor materials.

FIG. 6C shows a three dimensional schematic 640 of film thickness of the silicon oxide bonding layer illustrated in FIG. 6A as a function of the silicon tetrachloride partial pressure and the time period the substrate was exposed to the coating precursors after completion of addition of all precursor materials. The time period of exposure is shown on axis 642 in minutes, with the $SiCl_4$ partial pressure shown on axis 646 in Torr, and the oxide thickness shown on axis 646 in Angstroms. The $H_2O$ partial pressure in the silicon oxide coating deposition chamber was 4 Torr.

A comparison of FIGS. 6A-6C makes it clear that it is the partial pressure of the $H_2O$ which must be more carefully controlled in order to ensure that the desired coating thickness is obtained.

Figure 7B:
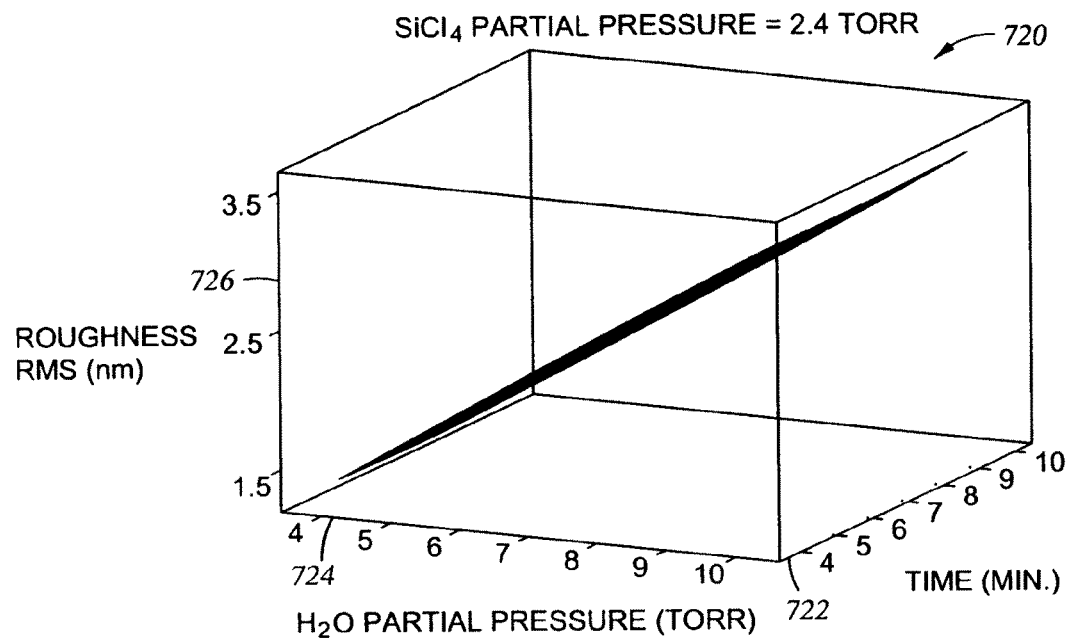
FIG. 7B shows a three dimensional schematic of film roughness in RMS nm of the silicon oxide bonding layer illustrated in FIG. 7A as a function of the water vapor partial pressure and the time period the substrate was exposed to the coating precursors after completion of addition of all precursor materials.

FIG. 7B shows a three dimensional schematic 720 of film roughness of the silicon oxide bonding layer illustrated in FIG. 6B as a function of the water vapor partial pressure and the time period the substrate was exposed to the coating precursors after completion of addition of all precursor materials. The time period of exposure of the substrate is shown on axis 722 in minutes, with the $H_2O$ partial pressure shown on axis 724 in Torr, and the surface roughness of the silicon oxide layer shown on axis 726 in RMS, nm. The partial pressure of the $SiCl_4$ in the silicon oxide coating deposition chamber was 2.4 Ton.

Figure 7C:
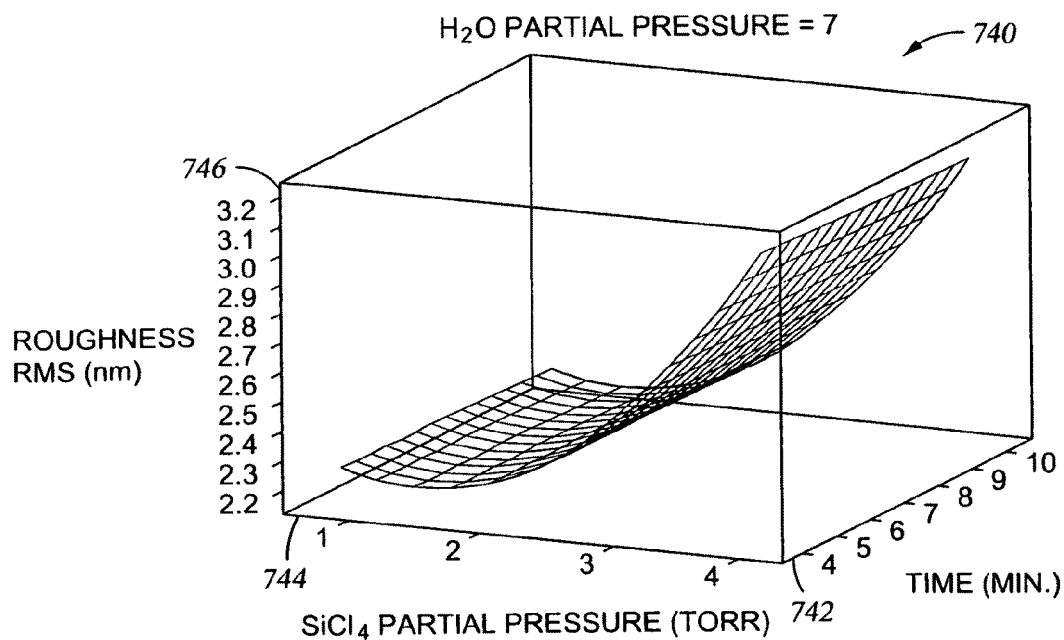
FIG. 7C shows a three dimensional schematic of film roughness in RMS nm of the silicon oxide bonding layer illustrated in FIG. 6A as a function of the silicon tetrachloride partial pressure and the time period the substrate was exposed to the coating precursors after completion of addition of all precursor materials.

FIG. 7C shows a three dimensional schematic 740 of film roughness thickness of the silicon oxide bonding layer illustrated in FIG. 6A as a function of the silicon tetrachloride partial pressure and the time period the substrate was exposed to the coating precursors after completion of addition of all precursor materials. The time period of exposure is shown on axis 642 in minutes, with the $SiCl_4$ partial pressure shown on axis 646 in Torr, and the surface roughness of the silicon oxide layer shown on axis 746 in RMS, nm. The partial pressure of the $H_2O$ in the silicon oxide coating deposition chamber was 7.0 Ton.

A comparison of FIGS. 7A-7C makes it clear that it is the partial pressure of the $H_2O$ which must be more carefully controlled in order to ensure that the desired roughness of the coating surface is obtained.

The above described exemplary embodiments are not intended to limit the scope of the present invention, as one skilled in the art can, in view of the present disclosure expand such embodiments to correspond with the subject matter of the invention claimed below.

We claim:

1. A method of depositing a coating on a substrate from a vapor phase, wherein a surface roughness of said coating is controlled by controlling a total pressure in a processing chamber in which said coating is deposited, a partial pressure of at least one coating precursor, and a temperature of a substrate on which said coating is deposited, wherein there are a plurality of coating precursors, and at least one of said coating precursors is charged to said process chamber in a batch-like addition by adding the at least one of said coating precursors into the process chamber in controlled aliquots, which may be repeated a number of times to provide a desired coating thickness, wherein the batch-like addition includes accumulating a specific quantity of the at least one of said coating precursors to define each controlled aliquot, and dosing of the accumulated specific quantity directly to the process chamber.

2. A method in accordance with claim 1, wherein at least one temperature of a major processing surface inside said processing chamber is also controlled.

3. A method in accordance with claim 1, wherein said surface roughness of said coating is also controlled by limiting a thickness to which said coating is permitted to grow.

4. A method in accordance with claim 1, wherein there are a plurality of coating precursors, and said coating precursors are charged to said process chamber essentially simultaneously.

5. A method in accordance with claim 1, wherein there are a plurality of coating precursors, and said coating precursors are charged to said process chamber in a predetermined sequence.

6. A method in accordance with claim 2, wherein said total pressure, said partial pressure of said at least one coating precursor, said temperature of said substrate, and said temperature of said at least one major component surface inside said processing chamber are controlled to drive the reaction location of said at least one precursor toward said substrate surface.

7. A method in accordance with claim 6, wherein said reaction location is on said substrate surface.

8. A method in accordance with claim 6, wherein said surface roughness of said coating is also controlled by limiting the thickness to which said coating is permitted to grow.

9. A method in accordance with claim 1, wherein said at least one coating precursor includes a silane selected from the group consisting of chlorosilanes, chlorosiloxanes, fluorosilanes, fluorosiloxanes and combinations thereof.

10. A method in accordance with claim 9, wherein said at least one precursor also includes water vapor.

11. A method in accordance with claim 9, wherein said silane is charged to said process chamber prior to charging of said water vapor.

12. A method of controlling the surface roughness of an organo-silicon-containing coating on a substrate, wherein said coating is deposited from a vapor phase, wherein at least one organosilane precursor for said coating is introduced into a coating deposition chamber in which said coating is deposited, followed by the introduction of water, and wherein said surface roughness is further controlled by controlling a total pressure in said deposition chamber, a partial pressure of at least one precursor, and a temperature of a substrate on which said coating is deposited, wherein at least one of said organosilane precursor and water is charged to said process chamber in a batch-like addition by adding said organosilane precursor or water into the process chamber in controlled aliquots, which may be repeated a number of times to provide a desired coating thickness, wherein the batch-like addition includes accumulating a specific quantity of the at least one of said coating precursors to define each controlled aliquot, and dosing of the accumulated specific quantity directly to the process chamber.

13. A method in accordance with claim 12, wherein at least two organosilane precursors are introduced into said coating deposition chamber, followed by the introduction of water, whereby controllable co-deposition of said organosilane precursors is obtained.

14. A method in accordance with claim 12, wherein a partial pressure of each precursor is controlled to adjust said surface roughness of said organosilane coating.

15. A method in accordance with claim 12, wherein a partial pressure of said water precursor is controlled to adjust said surface roughness of said organosilane coating.

* * * * *